United States Patent [19]
Kugishima et al.

[11] Patent Number: 5,444,275
[45] Date of Patent: Aug. 22, 1995

[54] RADIAL GATE ARRAY CELL

[75] Inventors: Masahiro Kugishima; Hiroyuki Sato; Masaaki Nariishi, all of Chiba; Noboru Yamakawa, Utsunomiya; Takahiro Yamamoto, Chiba, all of Japan

[73] Assignee: Kawasaki Steel Corporation, Hyogo, Japan

[21] Appl. No.: 58,665

[22] Filed: May 10, 1993

Related U.S. Application Data

[63] Continuation of Ser. No. 726,968, Jul. 8, 1991, abandoned.

[30] Foreign Application Priority Data

Jul. 10, 1990 [JP] Japan ................................ 2-182457

[51] Int. Cl.$^6$ ............................................ H01L 27/118
[52] U.S. Cl. ...................................... 257/206; 257/401
[58] Field of Search .................. 357/45; 257/206, 208, 257/204, 401

[56] References Cited

U.S. PATENT DOCUMENTS 4,799,096  1/1989  Koeppe .................... 357/45

FOREIGN PATENT DOCUMENTS 62-244148 10/1987 Japan .
64-89537  4/1989 Japan .
2018021 10/1979 United Kingdom .

Primary Examiner—William D. Larkins
Attorney, Agent, or Firm—Oliff & Berridge

[57] ABSTRACT

Gate width directions of transistors are taken in circumferential directions surrounding a certain point as a center. Or transistors are constructed by a plurality of straight lines extending in radial directions of the certain point and intersecting each other at the same angle. Hereby, basic cells can be assembled on a master slice symmetrically in plural directions. There are arranged in a mutual adjacent relation in which channel layers located under one opposing gate electrodes are formed into P channels and channel layers located under the other opposing gate electrodes are formed into N channels. Otherwise, there are arranged alternately with respect to P channels and N channels in an adjacent relation basic cells in which all channel layers located under all gate electrodes in the same basic cell are formed by any type of the P channel and the N channel.

12 Claims, 17 Drawing Sheets

F I G. 27
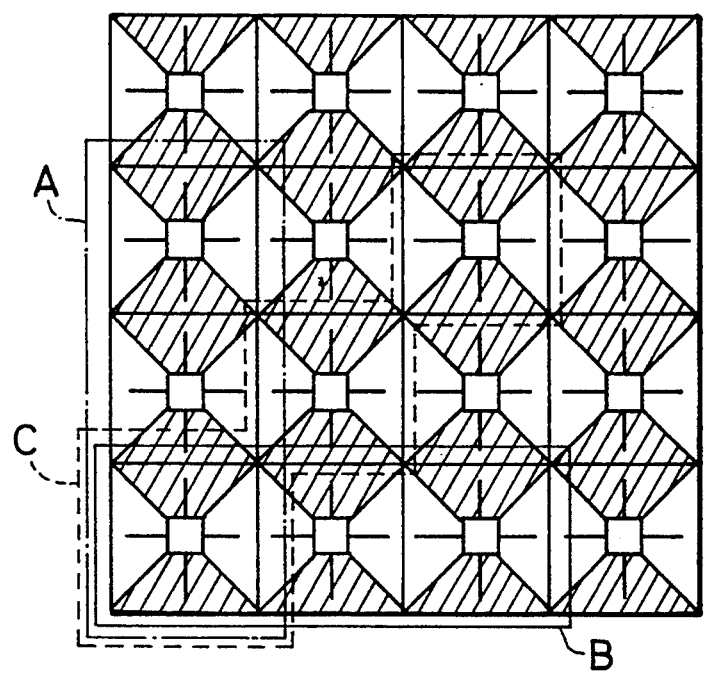

RADIAL GATE ARRAY CELL

This is a continuation of application Ser. No. 07/726,968 filed Jul. 8, 1991, now abandoned.

BACKGROUND OF THE INVENTION

1. Field of the Invention

The present invention relates to a basic cell and an arrangement structure of the same for use in a SOG (sea of Gates) type large scale integrated circuit (LSI).

2. Prior Art

FIGS. 1 and 2 illustrate the configuration and arrangement structure of a prior art basic cell as disclosed in Japanese Patent Kokai No. 59-44859.

The basic cell 5 is comprised of two P channel MOSFETs formed on an N region 1 and two N channel MOSFETs formed on a P region 3. The P channel MOSFETs include a pair of gate electrodes 2a, 2b symmetrically disposed on the N region 1 in the upper and lower regions with respect to a central line C. The N channel MOSFETs include a pair of gate electrodes 4a, 4b disposed on the P region 3 also symmetrically disposed in the upper and lower regions with respect to the same central line C.

The arrangement structure of the basic cell 5 in the SOG type LSI is as illustrated in FIG. 2. A master slice 6 contains columns of P channel transistors and columns of N channel transistors 8 alternately arranged. The basic cell 5 comprises a combination of the N and P channel MOSFETs of adjacent lines as indicated by a hatched portion in the same figure.

The basic cell structure described above is symmetrical only about the central line C, and hence when the master slice 6 is constructed using the basic cell 5, it is simply allowed to construct the same in a direction where different types of the transistors are disposed, i.e., in the horizontal directions in FIG. 2. It is however impossible to construct the basic cell in a direction where the same type of the transistors is disposed, i.e., in the vertical directions in the same figure. Therefore transistors cannot be used efficiently and hence semiconductor chip real estate is wasted.

For realizing logic cells such as logic gates and logic blocks, etc., on the semiconductor chip, sometimes realization of the same is impossible because of the arrangement structure of the basic cell 5 prevents successful realization. This is caused by the fact that the logic cells can not be constructed in the vertical directions.

Accordingly, high integration of elements in the SOG type LSIs is impractical and the flexibility of a wiring pattern design is limited.

SUMMARY OF THE INVENTION

In view of the drawbacks with the prior art, it is a first object of the present invention to provide basic cells useable symmetrically in plural directions, vertical and horizontal.

It is a second object of the present invention to provide an arrangement structure of basic cells which is capable of arranging the same logic gates and the same logic blocks constructed symmetrically in the plural directions perpendicularly to said directions.

To achieve the above first object, a basic cell of the present invention comprises at least one gate electrode of the same shape in at least two radial directions passing through a central point and intersecting each other at the same angle. The drain regions and source regions are formed on opposite sides of channel layers located under each gate electrode.

Further, to achieve the above first object, a basic cell of the present invention comprises one or more gate electrodes. Each gate electrode is arranged along a circumferential direction surrounding the central point. The basic cell is divided into regions of multiples of two by a plurality of radial straight lines passing through the central point. The angles between the radial straight lines are the same. Drain regions and source regions are formed on opposite sides of channel layers located under each of the gate electrodes.

Still further, to achieve the above first object, a basic cell of the present invention comprise one or more gate electrodes constructed by a plurality of substantially straight lines extending in radial directions. Each of the straight lines passes through the center point and intersects other straight lines at the same angle. Drain regions and source regions are formed on opposite sides of channel layers located under the gate electrodes.

In accordance with the basic cell of the present invention to embody the first object, of the gate electrodes of the transistors are in circumferential directions surrounding a central point or transistors are constructed by a plurality of straight lines extending in radial directions of the central point and intersecting each other at the same angle, so that the basic cell can be assembled symmetrically in plural directions on the master slice. This enables the respective transistors on the master slice to be effectively used and any wasteful space on a semiconductor chip to be eliminated.

To achieve the above second object, the basic cells of the present invention is arranged in a mutually adjacent relationship the channel layers located under the gate electrodes are of the opposite channel types as the adjacent channel layers. Thus, one channel layer is formed into P channels, while the channel layers located under the adjacent gate electrodes are formed into N channels.

Or instead of the above structure, an arrangement structure of basic cells of the present invention is adapted such that there are arranged in an alternately adjoining relation P and N channels of a plurality of the basic cells in which channel layers located under all gate electrodes in the same basic cell are formed by the type of one of the P channels and the N channels.

In accordance with the arrangement structure of the basic cells of the present invention to embody its second object, there are arranged in a mutually adjacent relation the basic cells in which the channel layers located under the one opposing gate electrodes are formed into P channels and the channel layers located under the other opposing gate electrodes are formed into N channels, or there are arranged in an adjacent relation a plurality of the basic cells alternately of the P channels and the N channels in which channel layers located under all gate electrodes in the same basic cell are formed with any ones of the P channels and the N channels. Hereby, a circuit configuration quite equivalent in the plural directions, left and right direction and upper and lower direction, for example, can be made up. Accordingly, upon realizing logic cells on a semiconductor chip those logic cells can be configured without limitation of the shapes thereof provided those logic cells can be realized on a utilization area.

There is therefore achieved high integration of devices in SOG type LSIs and further improved flexibility of wiring pattern designs.

These and other novel features and advantages of the present invention are described in or will become apparent from the following detailed description of preferred embodiments.

BRIEF DESCRIPTION OF THE DRAWINGS

The preferred embodiments will be described with reference to the drawings, wherein like elements have been denoted throughout the figures with like reference numerals, and wherein:

FIGS. 26 and 27 are plan views exemplarily illustrating arrangement structures of the basic cells according to the eighth embodiment of FIG. 25.

DESCRIPTION OF THE PREFERRED EMBODIMENT

Figure 1:
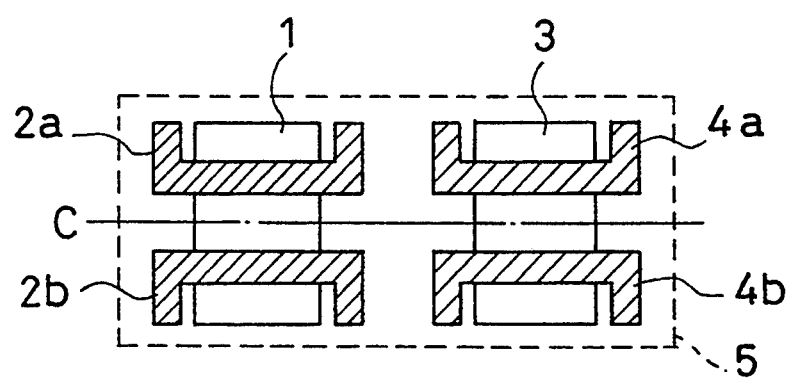
FIG. 1 is a plan view illustrating the structure of a prior art basic cell.
Figure 2:
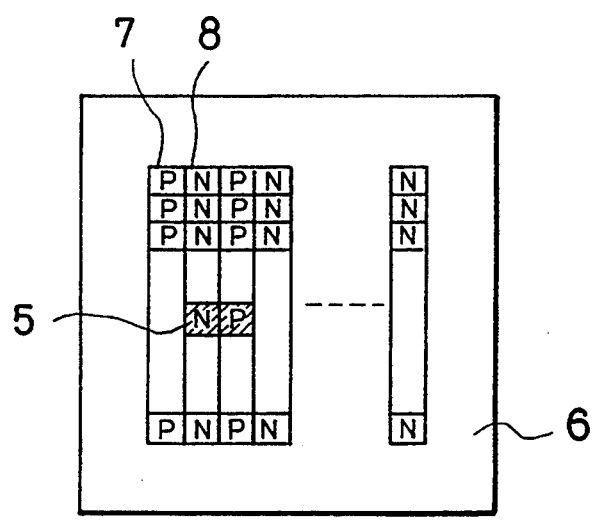
FIG. 2 is a plan view illustrating an arrangement structure of the prior art basic cell.
Figure 3A:
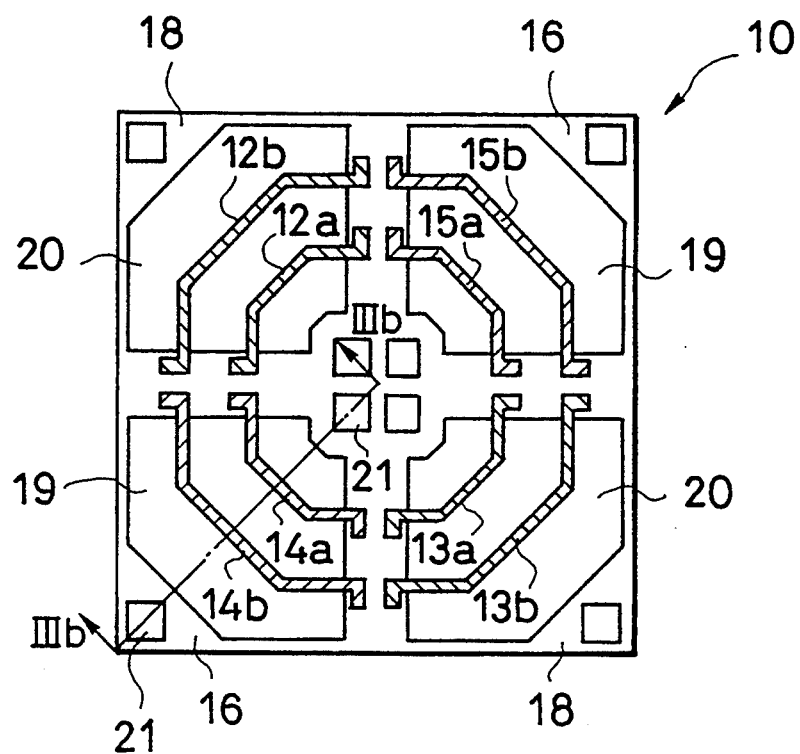
FIGS. 3a and 3b are a plan view-and a sectional each view illustrating the structure of a basic cell according to a first embodiment of the present invention.
Figure 3B:
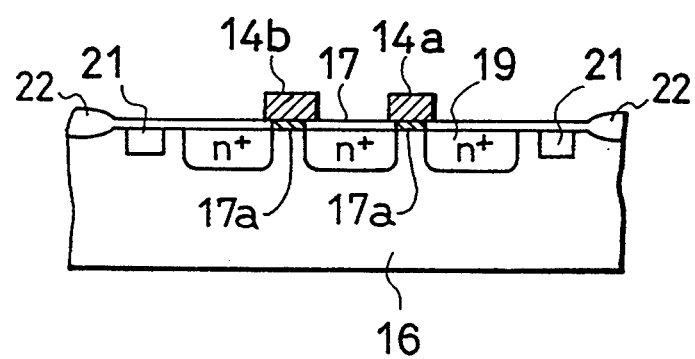

Referring now to FIGS. 3a and 3b, a basic cell structure in a SOG type LSI according to a preferred embodiment of the present invention is illustrated. More specifically, FIG. 3a is a plan view of a single basic cell 10 formed on a master slice, and FIG. 3b is a sectional view taken along a line IIIb—IIIb in FIG. 3a.

The basic cell 10 includes polygonal line-shaped paired gate electrodes 12 through 15 having gates extending along circumferential directions surrounding a central point of the basic cell and formed on the basic cell. These gate electrodes 12 through 15 correspond to four regions by dividing the whole gate electrodes by vertical and horizontal lines passing through the central point. Among gate electrodes 12 through 15 corresponding to the four divided regions, gate electrodes 14a, 14b and 15a, 15b are formed on P regions 16. An oxide film 17 is formed on a substrate under the gate electrodes 14, 15 as shown in FIG. 3b. Channel layers are formed under the gate electrodes via the oxide film 17. The other gate electrodes 12a, 12b and 13a, 13b are formed on N regions 18. There is formed a plurality of gate oxide portions 17a under the gate electrodes 12 and 13.

$n^+$ diffusion layers 19, doped with a high concentration n type impurity are formed in the P regions 16 located on opposite sides of the channel layers under the gate electrodes 14, 15 to form drain regions and source regions. $p^+$ diffusion layers 20, doped with a high concentration p type impurity are formed in the N regions 18 located on opposite sides of the channel layers under the gate electrodes 12, 13 to form drain regions and source regions as in the case in the P region 18. The P region 16 includes two substrate regions (well regions) 21 at the central and peripheral portions thereof, and in quite the same manner the N region 18 includes two substrate contacts (well contacts) 21 at the central and peripheral portions thereof.

The regions 18 and 18 are surrounded by the field oxide 22 and isolated from each other.

Figure 3C:
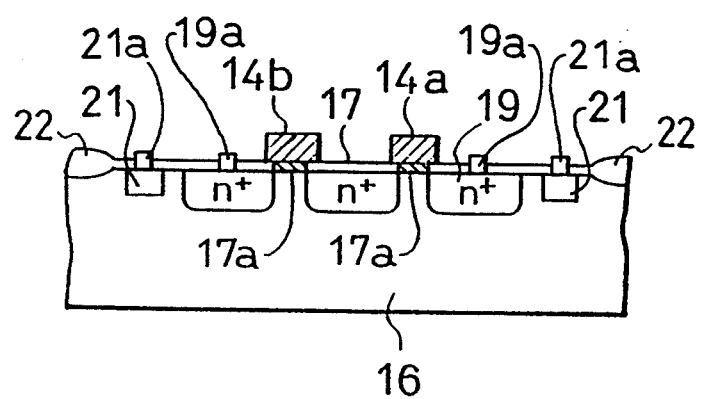
FIG. 3c is a sectional view of the basic cell shown in FIG. 3b after contacts are made.

With the structure described above, there are formed two P channel MOSFETs composed of the gate electrodes 12a, 12b in the one opposing N region 18, and two P channel MOSFETs composed of the gate electrodes 13a, 13b in the other opposing N region 18. Further, there are formed two N channel MOSFETs composed of the gate electrodes 14a, 14b in the one opposing P region 16, and two N channel MOSFETs composed of the gate electrodes 15a, 15b in the other opposing P region 16. As shown in FIG. 3c, contacts 19a and 21a are formed through oxide layer 17. The contacts 19a and 21a allow external connection to the diffusion regions 19 and well regions 21, respectively.

Figure 4A:
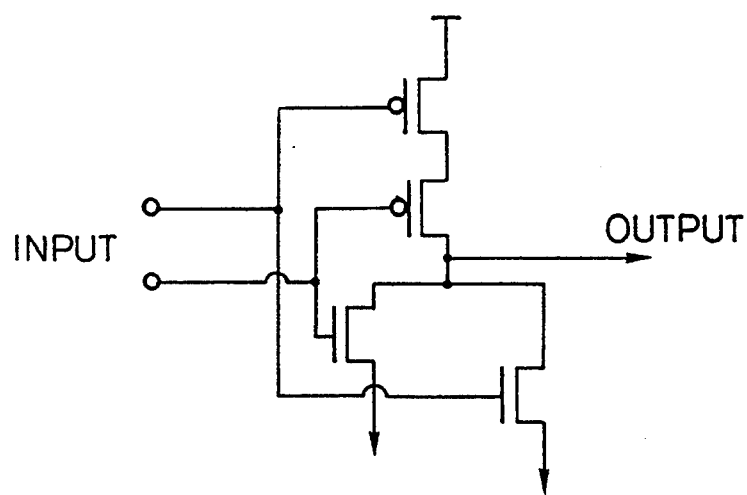
FIGS. 4a and 4b are diagrams each exemplarily illustrating circuits each constituted by a one side half of the first embodiment in which two transistors are provided in each divided region.
Figure 4B:
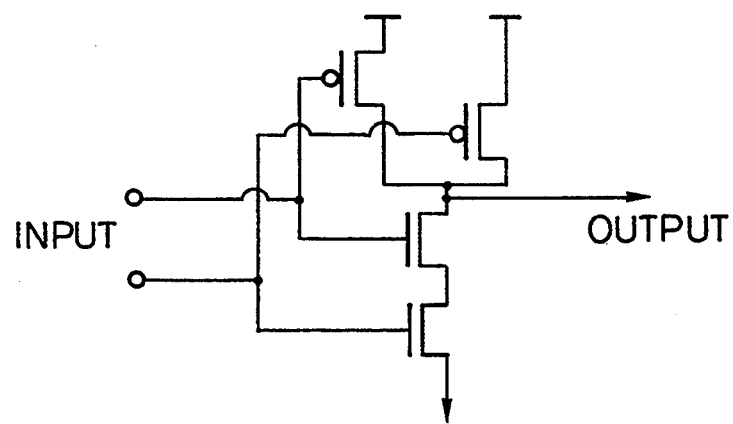

Since in the first preferred embodiment, where two transistors are formed in each divided region, there can be configured a two-input NOR gate in the one half of the basic cell as illustrated in FIG. 4a and a two-input NAND gate in the same half as illustrated in FIG. 4b for example.

Figure 5:
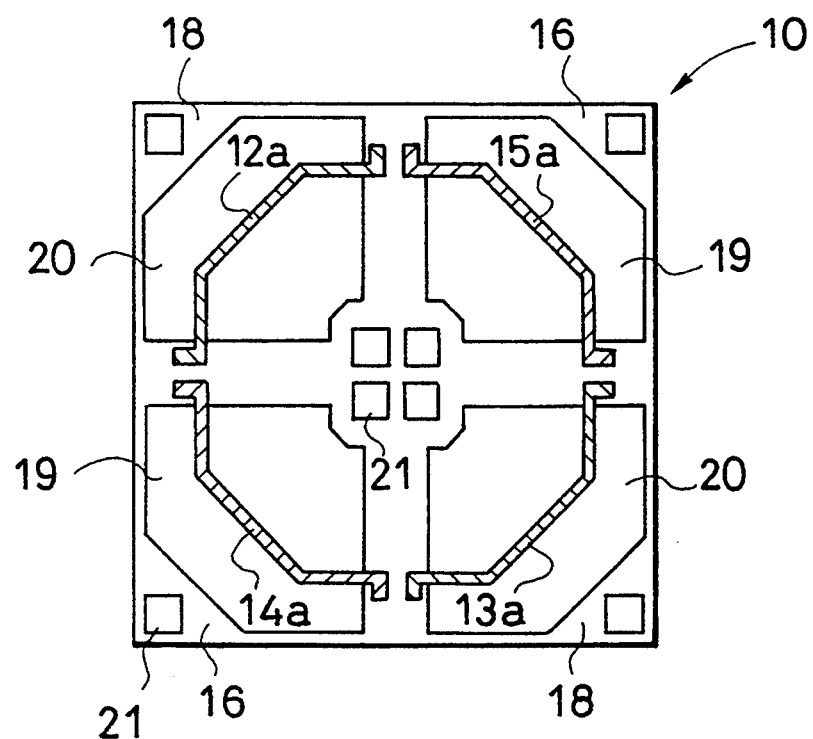
FIG. 5 is a plan view illustrating a modified structure of the basic cell in which one transistor is provided in each divided region.
Figure 6:
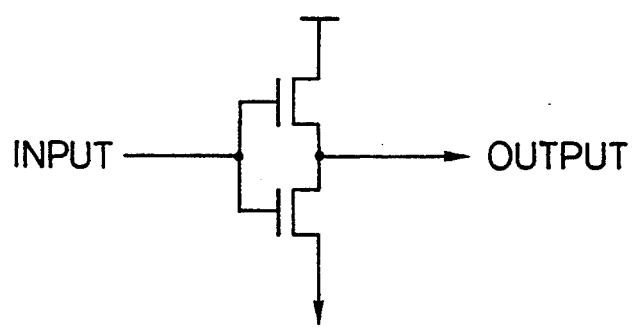
FIG. 6 is a diagram exemplarily illustrating a circuit constituted by a one side half of the modified structure of FIG. 5.
Figure 7:
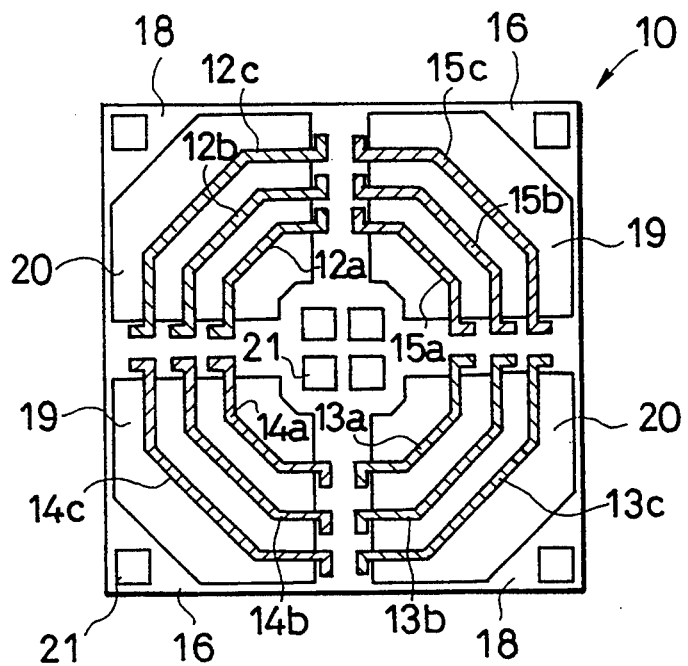
FIG. 7 is a plan view illustrating another modified structure of the basic cell in which three transistors are provided in each divided region.
Figure 8A:
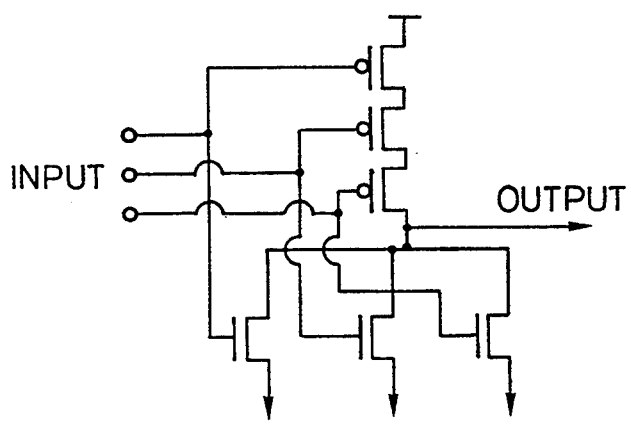
FIGS. 8a and 8b are circuit diagrams each exemplarily illustrating circuits each constituted by a one side half of the modified structure of FIG. 7.
Figure 8B:
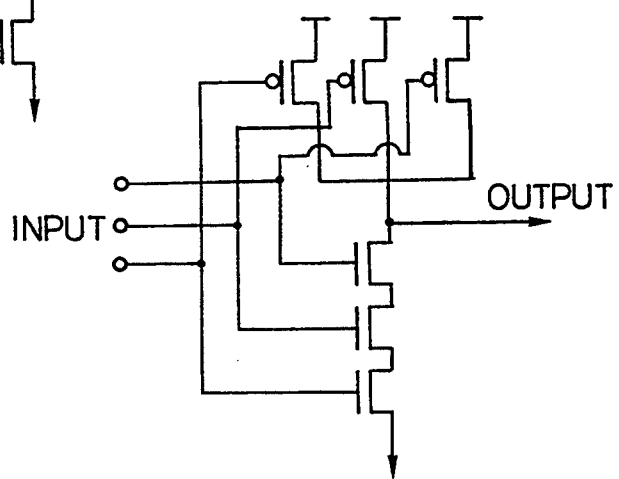

Further, varieties of logic blocks may be configured as follows: as a modified example illustrated in FIG. 5 one transistor may be formed in each divided region to construct an inverter in the one half of the basic cell as illustrated in FIG. 6 for example, as another modified example illustrated in FIG. 7 three transistors 12a through 12c, 13a through 13c, 14a through 14c and 15a through 15c may be formed in each divided region to construct a three-input NOR gate (two-input NOR gate also possible) in the one half of the basic cell as illustrated in FIG. 8a and construct a three-input NAND gate (two-input NAND gate also possible) in the same half as illustrated in FIG. 8b. Further, four transistors or more may be available in each divided region.

It can generally be said that as more transistors are disposed in a basic cell, more transistors are available to be used in view of the construction of logic blocks, so that high integration can be achieved to ease circuit design. Further, in case where a logic gate is intended to be constructed in a single basic cell and where three transistors as illustrated in FIG. 7 are formed in each divided region, sets of those three transistors can be arranged in series or in parallel to each other in the basic cell. A three-input NOR or HAND can be configured with the half of the basic cell as illustrated in FIGS. 8a and 8b. This assures higher integration than in cases of a single transistor or of two transistors. Herein, it is noted that in case of multiple transistors, the gate widths thereof may be the same or different.

Figure 9:
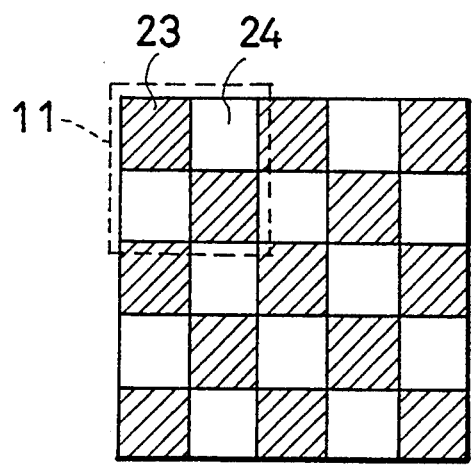
FIG. 9 is a plan view exemplarily illustrating an arrangement structure of the basic cells according to the first embodiment.

The basic cell 10 is arranged on the master slice as denoted by numeral 11 in FIG. 9. In the figure, hatched portions 23 indicate the N region 18 on which the P channel MOSFETs are formed, while blank portions 24 indicate the P regions 16 on which the N channel MOSFETs are formed. More specifically, the single basic cell 10 comprises as broken line section 11 in the same figure, and the arrangement structure of the basic cells according to the present invention is adapted such that a plurality of the basic cells 11 are arranged adjoining to each other.

Although in the first embodiment, the four divided regions in the single basic cell are constructed with different channel types in the adjacent regions, the four regions may be constructed with the same channel type within the same basic cell. It is possible, as a modified example illustrated in FIG. 10, to alternately arrange the basic cells 11P all containing P channels, and the basic cells 11N containing all N channels. When all four regions are constructed with the same channels, two transistors are formed in each divided region a maximum of eight transistors are available with the single basic cell and allow an eight-input NAND gate and an eight-input NOR gate, etc., to be constructed.

In accordance with the first preferred embodiment since the gates of the paired gate electrodes 12 through 15 surrounds the central point of the basic cell 10, the basic cells 11 can be symmetrically used on the master slice in the upper and lower directions and in the left and right directions. Further, since a plurality of the basic cells 11 are arranged adjoining to each other, logic cells such as NAND gate, flip-flop etc., can be constructed quite equivalently in the upper and lower directions and in the left and right directions on the master slice. Accordingly, in accordance with the present embodiment, transistors on the master slice are made effectively usable to increase the degree of integration of elements in SOG type LSIs. Furthermore, since the flexibility of wiring pattern design is increased, a SOG type LSI which satisfies a required function can be developed in a short time.

Additionally, since the substrate contact (well contact) 21 can be formed in close vicinity of the diffusion layer 19 (diffusion layer 20), there is such an advantage that any realized MOSFET has less possibility of being latched up.

Figure 11:
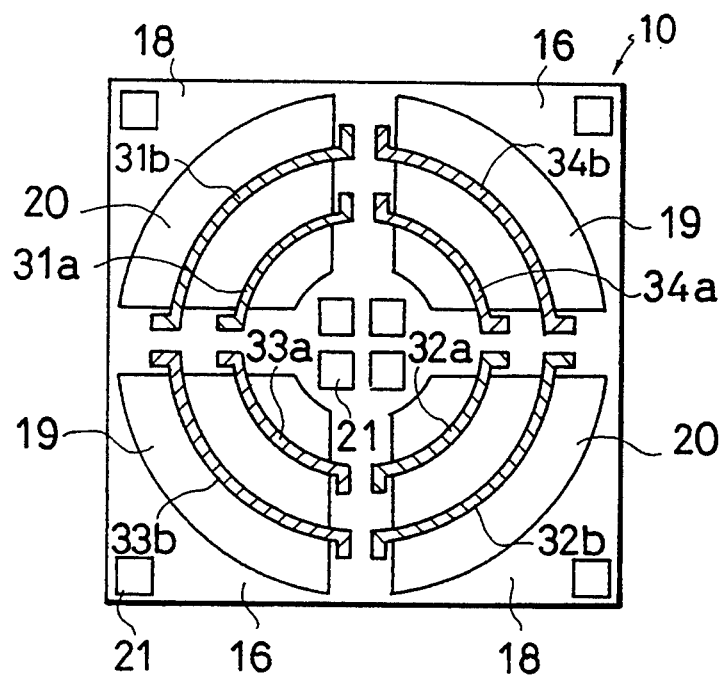
FIG. 11 is a plan view illustrating the structure of a basic cell according to a second embodiment of the present invention.
Figure 12:
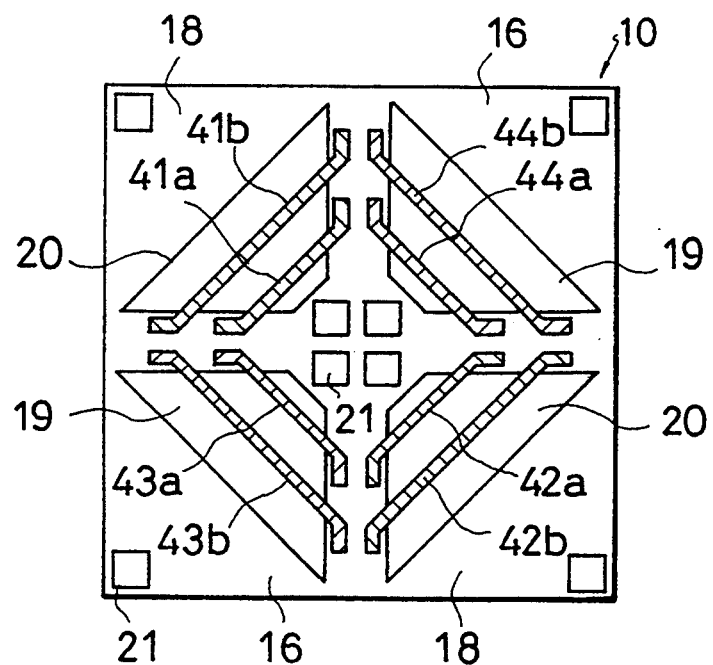
FIG. 12 is a plan view illustrating the structure of a basic cell according to a third embodiment of the present invention.

Referring now to FIGS. 11 and 12, the structures of the basic cells according to the second and third preferred embodiments of the present invention are illustrated. The same or corresponding portions as those in FIG. 3a are denoted by the same symbols and hence the description thereof will be omitted.

These preferred embodiments differ only in the shapes of the gate electrodes only the shapes of the gate electrodes are different from each other from the case of the first preferred embodiment. The structure is substantially the same as that of the first preferred embodiment for other structures. More specifically, although in the second preferred embodiment of FIG. 11 gate electrodes 31 through 34 surrounds the central point of a basic cell 10, the entire appearance (shape) of those gate electrodes is formed into a circular shape (arcuated in each divided region). In contrast, the first preferred embodiment was formed into a polygonal shape.

In the third embodiment of FIG. 12, gate electrodes 41 through 44 are formed into a square shape (linear in each divided region). Herein, the gate electrodes 31 through 34, and 41 through 44 in the respective preferred embodiments have shapes divided into four regions by vertical and horizontal lines passing through the central point, as in the first embodiment.

It is appreciated that in the preferred embodiments, the number of the transistors may be one or more.

Figure 10:
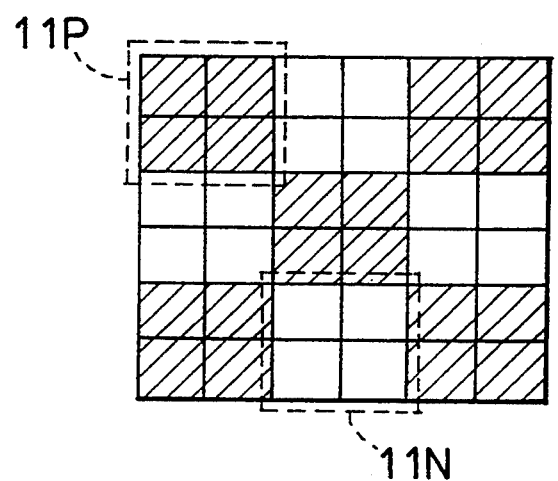
FIG. 10 is a plan view illustrating a modified example of the arrangement structure.

Additionally, arrangement structures of the basic cells 10 in the respective embodiments are likewise illustrated in FIG. 9 or FIG. 10.

The second and third embodiments demonstrate the same function as in the first embodiment. More specifically, the basic cells 10 can be symmetrically assembled on a master slice in the upper and lower directions and in the left and right directions, and logic cells can be configured completely equivalent in the upper and lower directions and in the left and right directions.

Figure 13:
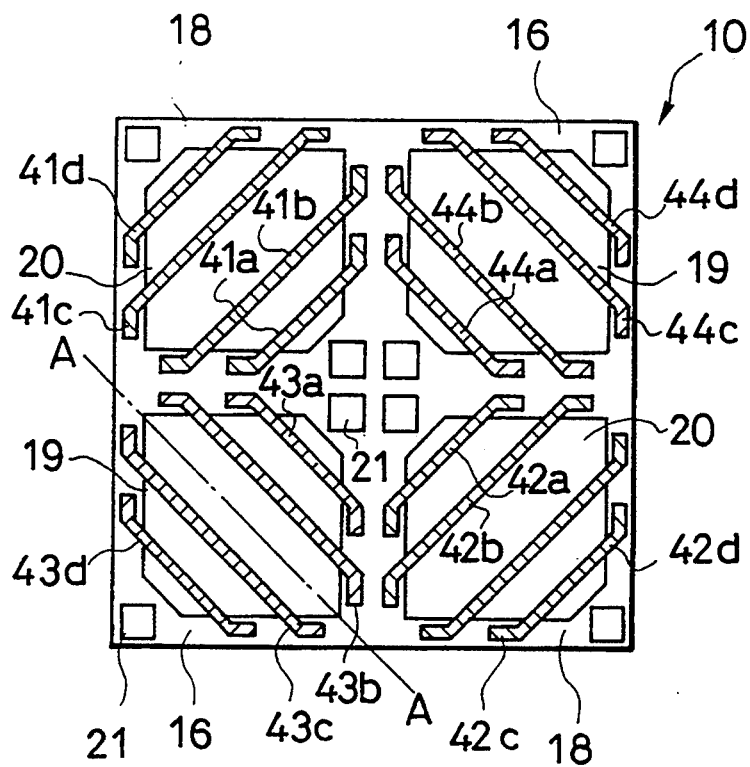
FIG. 13 is a plan view illustrating the structure of a basic cell according to a fourth embodiment of the present invention.

Referring to FIG. 13, a fourth preferred embodiment of the present invention will be described.

The fourth embodiment is the third embodiment modified such that the linear gate electrodes, 41c, 41d, 42c, 42d, 43c, 43d and 44c, 44d are symmetrically incorporated with respect to a diagonal line A—A of widthwise direction of the transistors in the respective divided regions.

Figure 14:
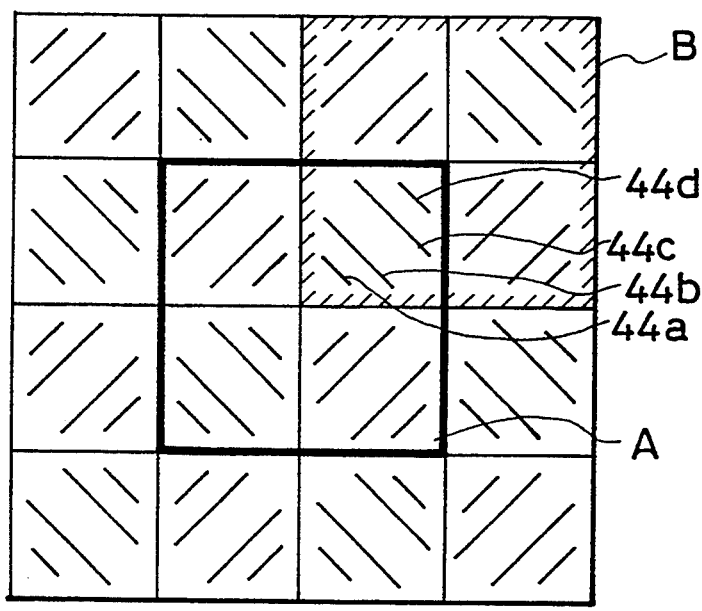
FIG. 14 is a plan view exemplarily illustrating an arrangement structure of the basic cells according to the fourth embodiment of FIG. 13.
Figure 15:
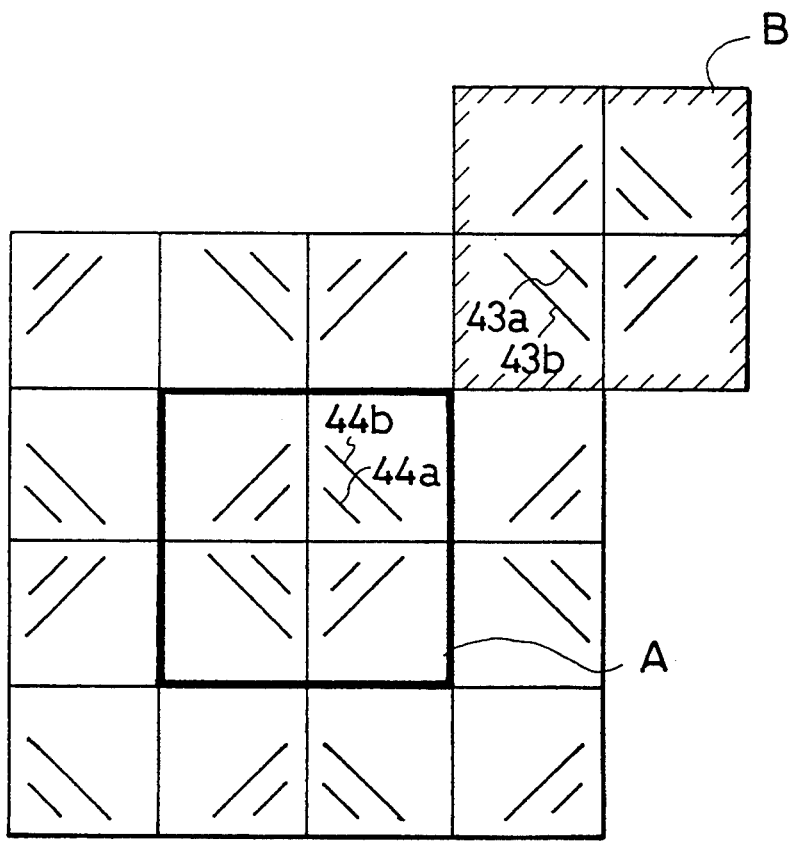
FIG. 15 is a plan view exemplarily illustrating an arrangement structure of the basic cells according to the third embodiment of FIG. 12.

In accordance with the fourth embodiment, as illustrated in FIG. 14, logic blocks can be arranged in an adjacent oblique relation and share the same divided region. Unused cell regions are reduced when the same logic blocks A, B are configured not only in the upper and lower directions and in the left and right directions but in a diagonal direction to assure effective circuit design. In contrast, in the third embodiment, the same logic blocks are intended to be configured, diagonally without having drastic changes of the wiring pattern, one basic cell should completely be shifted as illustrated in FIG. 15.

Figure 16:
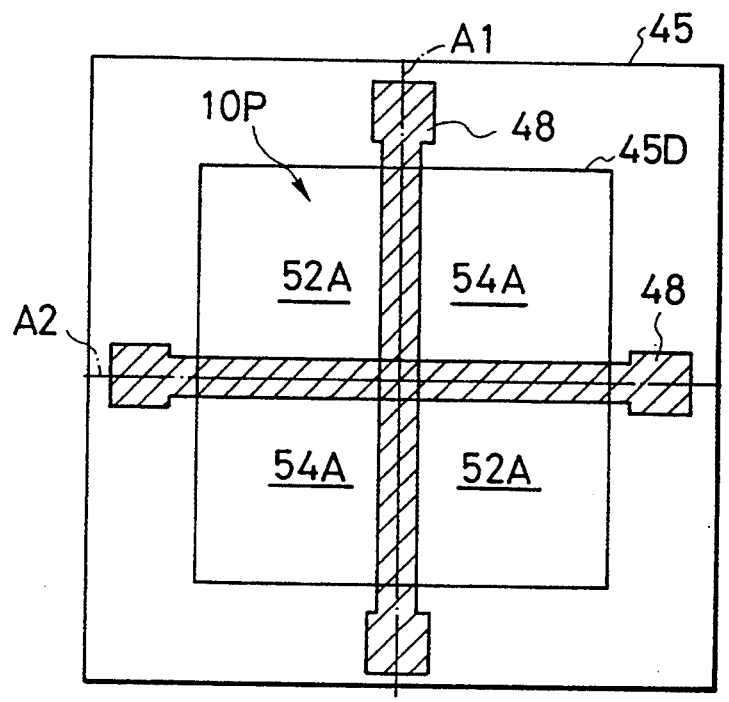
FIGS. 16 and 17 are plan views each illustrating the structures of basic cells according to a fifth embodiment of the present invention.
Figure 17:
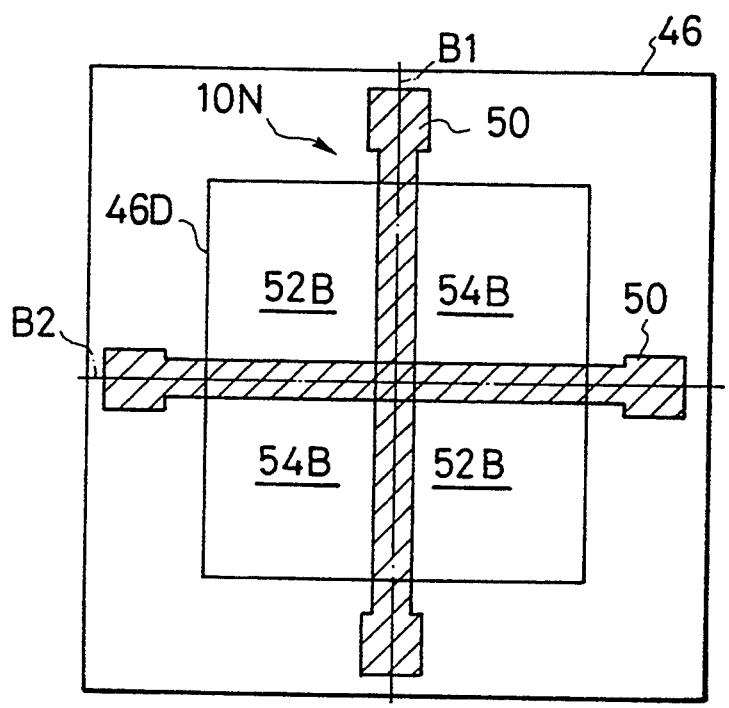

FIG. 16 shows a fifth preferred embodiment of the basic cell.

The fifth embodiment provides a basic cell 10P which forms a P channel MOS (PMOS) transistor and a basic cell 10N which forms an N channel MOS (NMOS) transistor. Those basic cells include wells 45, 46 configured symmetrically in the upper and lower directions and in the left and right directions, and gate electrodes 48, 50 formed on the central lines A1, A2, B1, B2 of the wells. The central lines are symmetrical axes of the wells in the upper and lower directions and in the left and right directions. Sections of the diffusion layers 45D, 46D defined by the gate electrodes 48, 50 present source regions 52A, 52B and drain regions 54A, 54B alternately.

The diffusion layers 45D, 46D are configured into square shapes and the gate electrodes 48, 50 on the central lines of the wells 45, 46 have the same longitudinal length.

The basic cells associated with the fifth embodiment therefore form PMOS transistors in the upper and lower directions and in the left and right direction on the gate formation planes of the wells, and NMOS transistors in the same directions. Thus, in the basic cells 10P, 10N, which are usable symmetrically up and down and left and right, flexibility of circuit design is increased and unused regions of the gates are decreased to make the circuit compact compared with the prior basic cells wherein logic gates can be arranged only in one direction.

Figure 18:
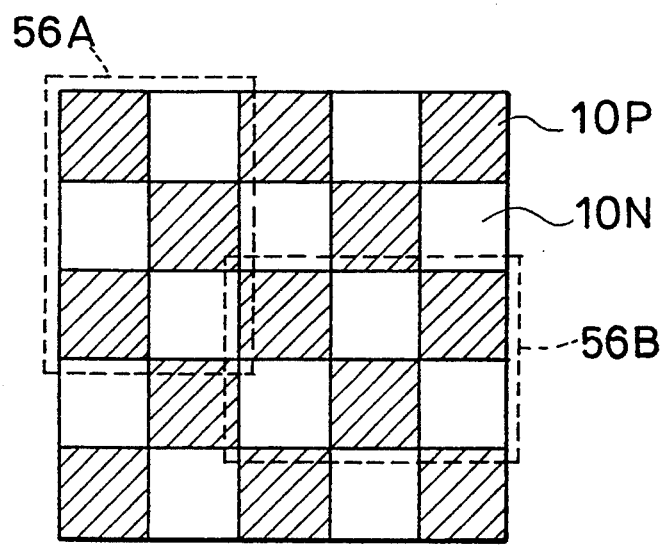
FIG. 18 is a plan view exemplarily illustrating formation of a logic block on a chip in accordance with the fifth embodiment of FIGS. 16 and 17.

In an arrangement structure where six basic cells comprising the basic cells 10P of PMOS transistors, alternately arranged with the basic cells 10N of NMOS transistors, both of the fifth embodiment, on a chip in the logic blocks can be configured transversely and longitudinally without distinction of those directions as indicated by broken lines 56A and 56B in FIG. 18. It is therefore understood that flexibility of circuit design is increased and unused regions in the basic cell is reduced to minimize the circuit. Further, use of the six basic cells allows logic block up to a three-input HAND gate for example to be configured.

In the following, a sixth preferred embodiment will be described.

Figure 19:
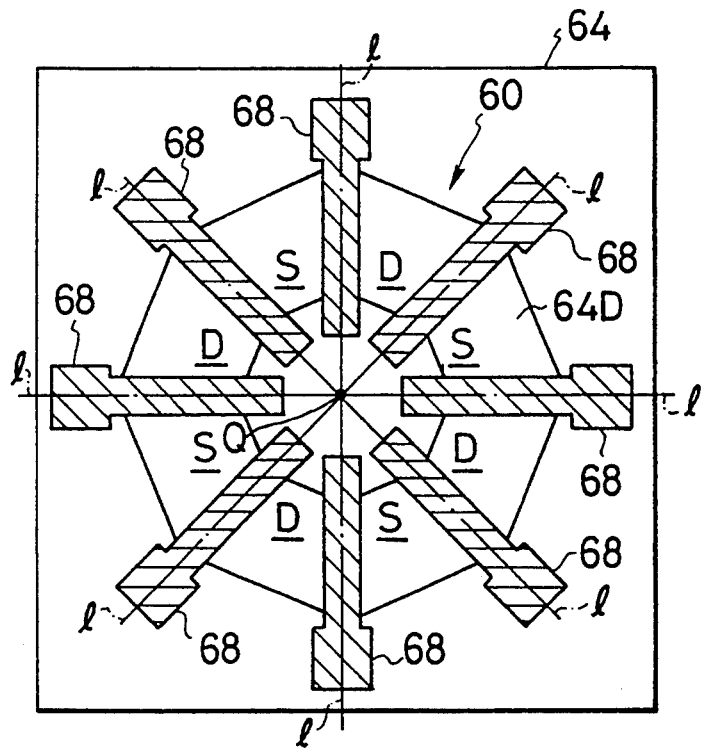
FIGS. 19 and 20 are plan views each illustrating the structures of basic cells according to a sixth embodiment of the present invention.
Figure 20:
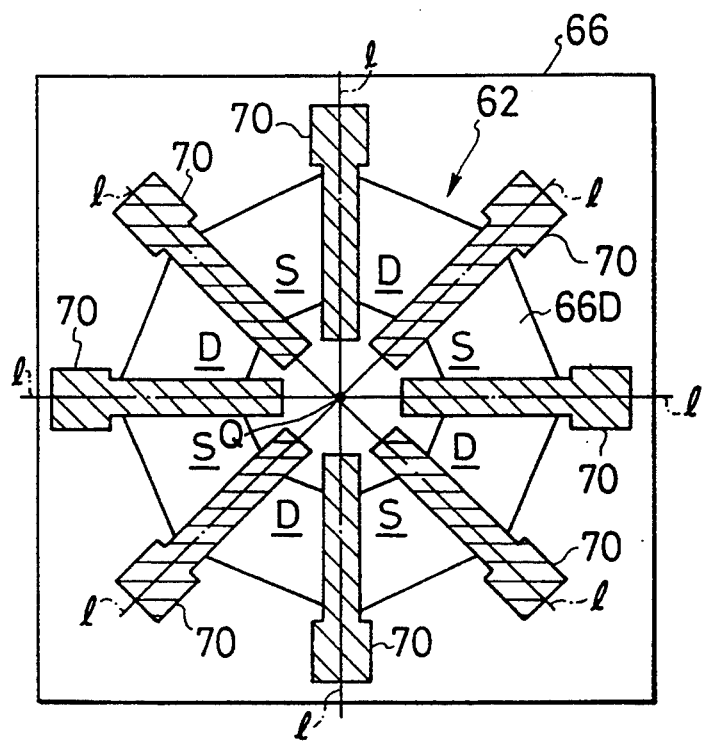

The sixth embodiment provides a basic cell 60 comprising PMOS transistors as shown in FIG. 19 and a basic cell 62 comprising NMOS transistors as shown in FIG. 20. Those basic cells include wells 64, 66 shaped symmetrically in the upper and lower directions and in the left and right directions. Gate electrodes 68, 70 are each disposed along radial lines 1 taking as the center the central point Q of the gate formation planes on the wells 64, 66 and formed on the wells 64, 66 excepting the neighbourhood of the central point Q. Sections of the diffusion layers defined by the gate electrodes 68, 70 present source regions (indicated by a symbol S) and drain regions (indicated by a symbol D) alternately.

The diffusion layers 64D, 66D are regular octagonally shaped in the present embodiment as illustrated in FIGS. 19 and 20. The gate electrodes 68, 70 have the same longitudinal length thereof.

Figure 21:
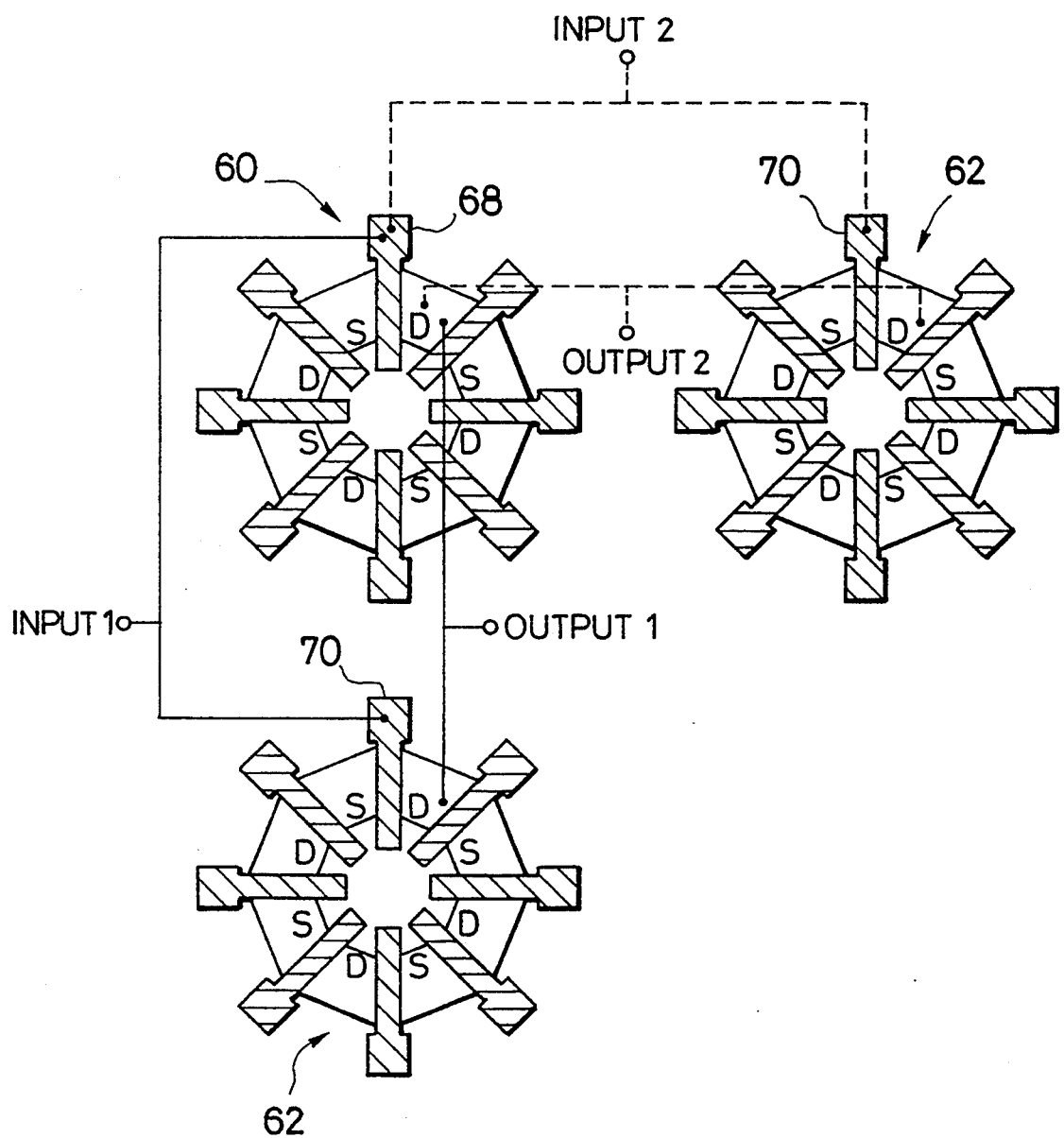
FIGS. 21 and 22 are plan views exemplarily illustrating logic circuits constructed by the basic cells according to the sixth embodiment of FIGS. 19 and 20.
Figure 22:
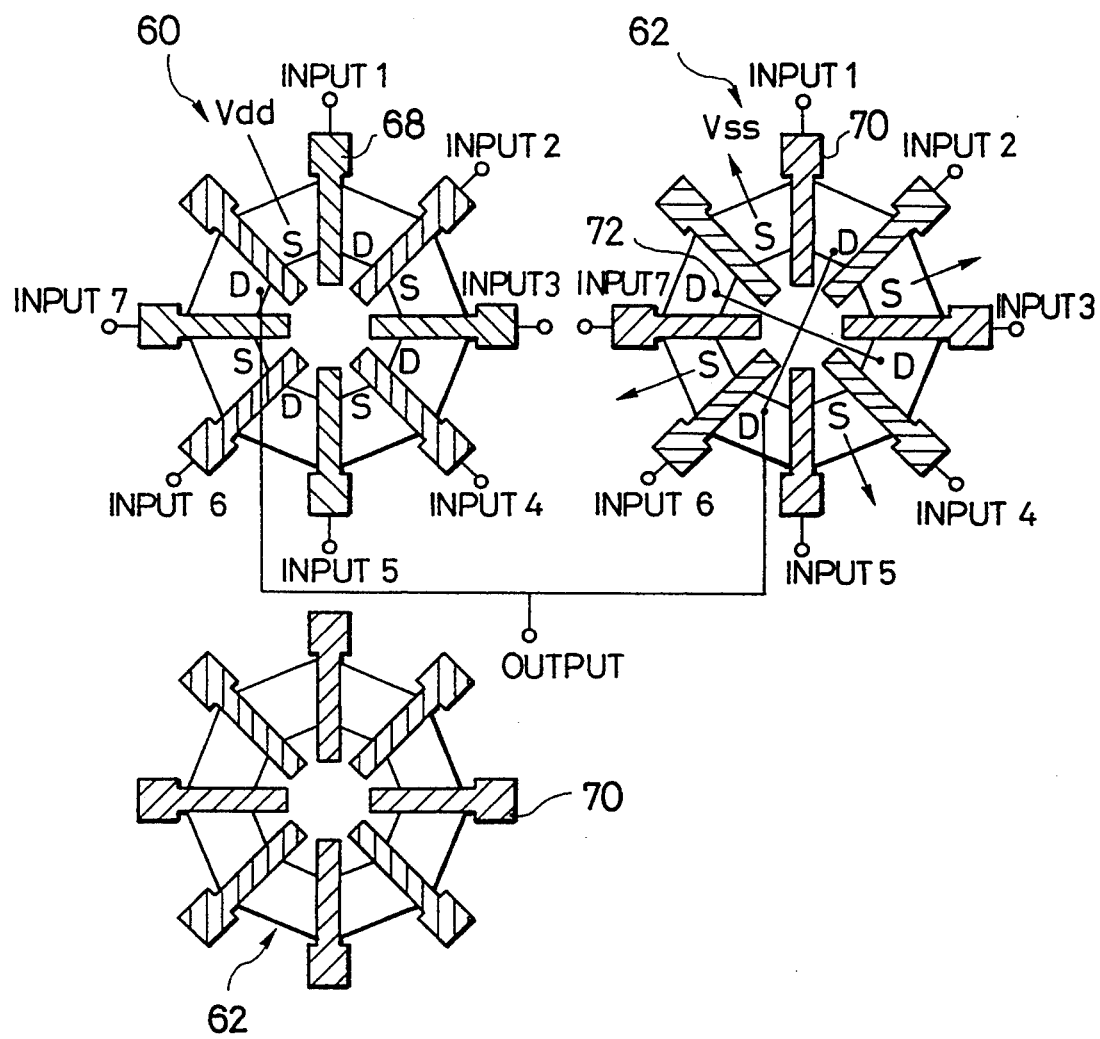

Thus, the basic cells 60, 62 associated with the sixth embodiment form PMOS transistors and NMOS transistors, by circumferentially placing the gate electrodes 68, 70 therebetween. Accordingly, since the basic cells 60, 62 are usable symmetrically up and down and left and right, flexibility of circuit design is increased and unused regions of the gates are decreased as in the fifth embodiment. Further parallel and/or series connection of transistors, which were not attained in the fifth embodiment, can be constructed by properly selecting and combining the gate electrodes 68, 70 to be connected. As illustrated in FIGS. 21 and 22 for example relatively complicated circuit can be constructed. Hereby, there are further improved high integration and design flexibility compared with the fifth embodiment.

In a chip of an arrangement structure where there are alternately arranged the basic cells 60 comprising the PMOS transistors and the basic cells 62 comprising the NMOS transistors on the chip in the upper and lower directions and in the left and right directions, an exemplarily circuit incorporating the two basic cells as a pair is illustrated in FIGS. 21 and 22.

In FIG. 21, an inverter circuit is constructed with a pair of the basic cell 60 of the PMOS transistors and the basic cell 62 of the NMOS transistors. The inverter circuit is constructed such that an input 1 is connected to gate electrodes 68, 70 of a pair of the basic cells 60, 62 disposed transversely, and an output 1 is connected to drains D adjacent to the gate electrodes 68, 70. Further, the inverter circuit can also be constructed with a pair of the basic cells 60, 62 disposed transversely as indicated by a broken line in FIG. 21 without being limited to the construction with the longitudinal basic cells 60, 62.

Herein, it should be noted that the outputs 1, 2 demonstrate an equivalent inverter output for the inputs 1, 2 irrespective of selection of either of the longitudinal and transverse basic cells 60, 62.

Further, as illustrated in FIG. 22, a pair of the basic cells 60, 62 can construct a seven-input NOR. The NOR circuit is constructed by using seven gate electrodes among gate electrodes 68, 70 of the basic cells 60, 62 as input terminals 1 through 7. A drain D adjacent to the input 7 of the PMOS transistor basic cell 60 is connected to an output while all drain D of the NMOS transistor basic cell 62 are connected to the output through an aluminum wiring 72. Sources S adjacent to the inputs 1 are supplied with powers Vdd and Vss for the present circuit.

It is noted that such a seven-input NOR can be constructed irrespective of selection of either of the longitudinal and transverse basic cells 60, 82.

As understood from the above description, since in the present basic cell structure, the basic cells 60, 82 used have in themselves the gate electrodes 68, 70 extending not only transversely and longitudinally but also obliquely. Thus, flexibility on circuit design is further increased. Additionally, although in the fifth embodiment up to six basic cells are used to construct the three-input NAND gate, in the sixth embodiment, only a pair (two) of the basic cells is needed to construct even the up-to-seven-input NOR or NAND, for example. Accordingly, in the sixth embodiment there is more increased flexibility on circuit design than in the fifth embodiment to improve miniaturization and integration of chip configuration of any semiconductor integrated circuit.

Figure 23:
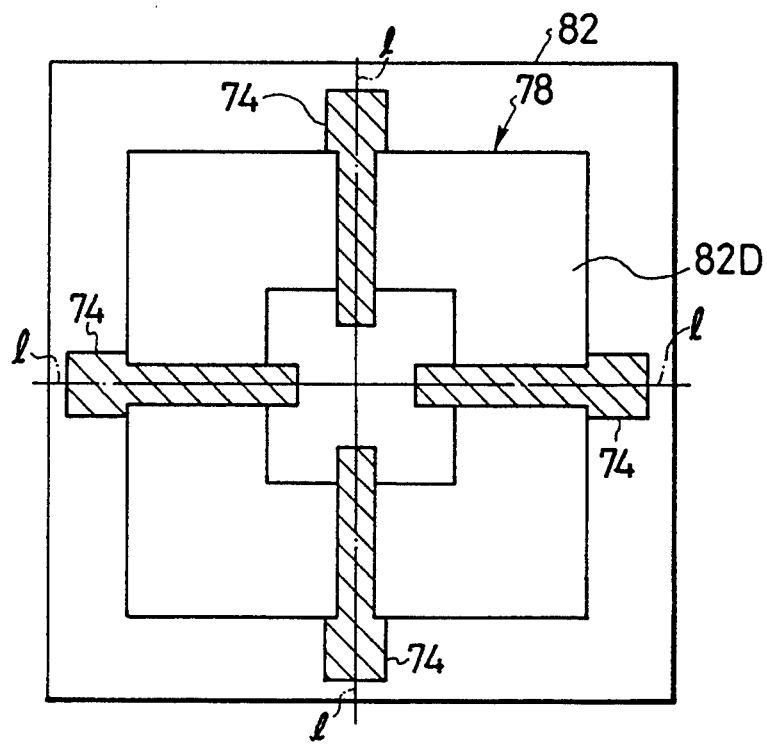
FIGS. 23 and 24 are plan views each illustrating the structures of basic cells according to a seventh embodiment of the present invention.
Figure 24:
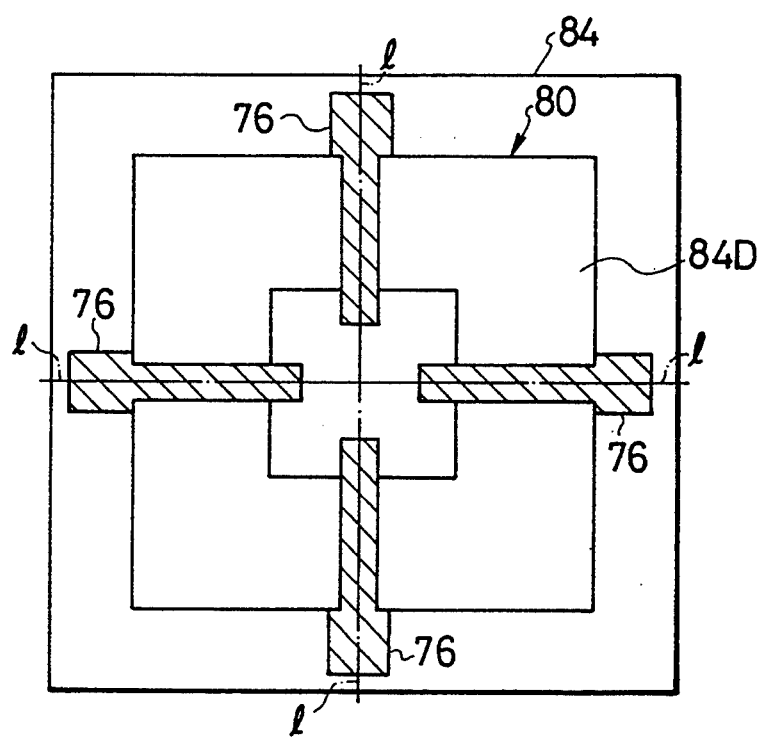

Although in the sixth embodiment there are eight gate electrodes 68, 70 provided in the basic cells 60, 62 around the central point Q as illustrated in FIGS. 19 and 20, the gate electrodes are not limited thereto, and the number of the gate electrodes may be arbitrary provided they are disposed along the radial lines 1 taking the central point as the center. For example, as described in the seventh embodiment illustrated in FIGS. 23 and 24, there can be formed a basic cell 78 comprising PMOS transistors having four gate electrodes 74 and a basic cell 80 comprising NMOS transistors having four gate electrodes 76 both excepting the central joint point of the gate electrodes of the fifth embodiment. In the same figures designated at 82D, 84D and 82, 84 are diffusion layers and wells respectively.

Furthermore, although in the fifth through seventh embodiments the diffusion layers 45D, 46D, 64D, 66D and 82D, 84D of the basic cells 10P, 10N, 60, 02 and 78, 80 are formed into squares, or regular polygonal shapes, diffusion layer shapes upon embodying the present invention are not limited to such shapes, those diffusion layers may be constructed into other shapes symmetrical up and down and left and right. For example, the diffusion layers may be configured into circuit shape.

In addition, in embodying said basic cells of the fifth through seventh embodiments, a p-well process or n-well process can be adopted in place of said twin-well process.

Figure 25:
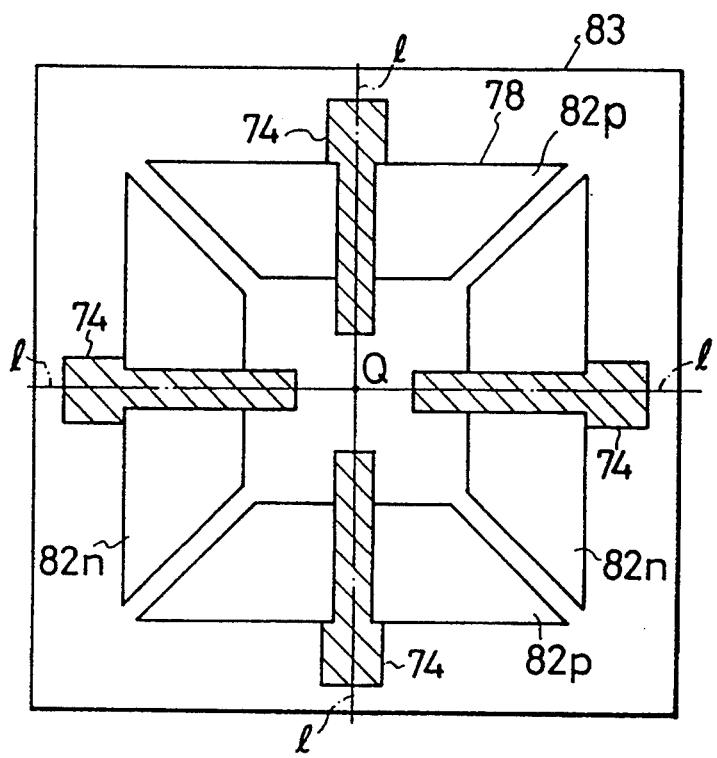
FIG. 25 is a plan view illustrating the structure of basic cell according to an eighth embodiment of the present invention.

Further, as in an eight embodiment of a basic cell 83 shown in FIG. 25, diffusion layer may be circumferentially divided into eight diffusion regions by two diagonal lines and four gate electrodes 74, and p type diffusion layer 82p and n+ type diffusion layer 82n can be provided alternately.

Figure 26:
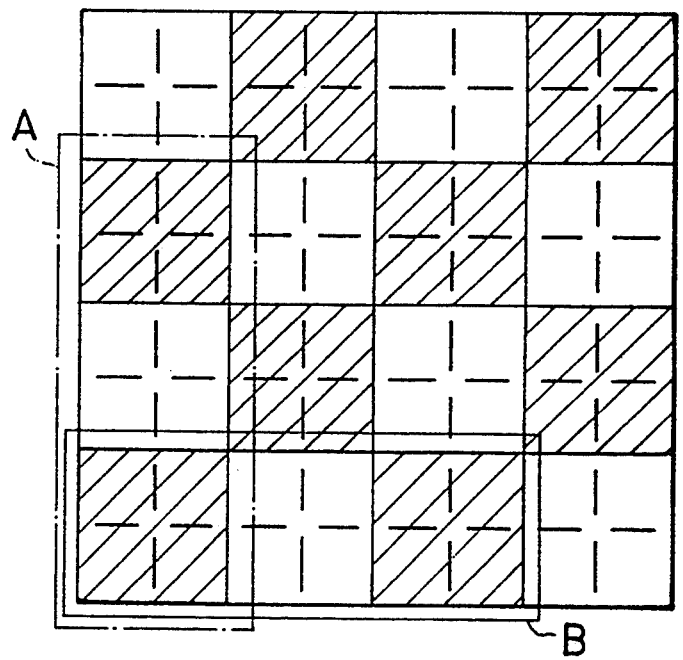

According to the eight embodiment, essentially same logic gate can be arranged not only in the up and down direction A and in the right and left direction B as shown in FIG. 26 as in the other embodiments, but also in the oblique direction C as shown in FIG. 27.

What is claimed is:

1. An integrated circuit comprising a plurality of basic cells arranged in a matrix over a semiconductor substrate, each of the basic cells comprising:
   a cell region having a center;
   four subcells arranged radially around said center, each subcell comprising at least two MOSFET transistors, with the MOSFET transistors of subcells on first diagonally opposite sides of said center being N-channel type and the MOSFET transistors of subcells on second diagonally opposite sides of said center being P-channel type;
   each N-channel MOSFET comprising a source region and a drain region of N-conductivity type, with a portion of the semiconductor substrate between the source region and the drain region overlaid by a gate insulator layer and the gate insulator layer overlaid by a gate electrode;
   each P-channel MOSFET comprising a source region and a drain region of P-conductivity type, with a portion of the semiconductor substrate between the source region and the drain region overlaid by a gate insulator layer and the gate insulator layer overlaid by a gate electrode; and
   the gate electrodes of the MOSFET transistors in a cell being generally perpendicular to a radial line from the center of the cell to the gate electrode.

2. The integrated circuit of claim 1, wherein the MOSFET transistor gate electrodes have a substantially polygonal line shape.

3. The integrated circuit of claim 1, wherein the MOSFET transistor gate electrodes have a substantially arcuate line shape.

4. The integrated circuit of claim 1, wherein the MOSFET transistor gate electrodes have a substantially straight line shape.

5. The integrated circuit of claim 1, wherein two MOSFET transistors are formed in each subcell.

6. The integrated circuit of claim 1, wherein three MOSFET transistors are formed in each subcell.

7. The integrated circuit of claim 1, wherein the four subcells are vertically and horizontally symmetrically arranged about the center.

8. The integrated circuit of claim 1, wherein the gate electrodes are formed symmetrically about the center.

9. The integrated circuit of claim 8, wherein the plurality of basic cells is arranged in a first pattern and a second pattern, each basic cell of the first pattern overlapping four basic cells of the second pattern by one subcell.

10. An integrated circuit comprising a plurality of basic cells arranged in a matrix of cells which repeat in both a row and column direction over a semiconductor substrate, each of the basic cells comprising:
    a cell region having a center;
    at least four MOSFET transistors arranged radially around said center, each MOSFET transistor having a source and drain region of one conductivity type separated by a channel region of the opposite conductivity type, said channel region being overlaid by a gate insulator, said gate insulator being overlaid by a gate electrode, with the gate electrodes of the MOSFET transistors of each cell region extending generally along a respective axis extending radially from the center of the respective cell, and the source and drain regions of each MOSFET transistor lying on opposite sides of the gate electrode of the respective MOSFET transistors; and
    adjacent basic cells in both the row direction and the column direction being of opposite conductivity type, so that basic cells having P-type source and drain regions alternate with basic cells having N-type source and drain regions in both the row direction and the column direction.

11. The integrated circuit of claim 10, wherein the gate electrodes are separated from each other at the center.

12. The integrated circuit of claim 10, wherein four gate electrodes are provided on the basic cell region, the four gate electrodes being arranged in vertical and horizontal directions such that the MOSFET transistors are arranged vertically and horizontally symmetrically about the center.

* * * * *